United States Patent [19]
Piotrowski

[11] Patent Number: 5,219,068
[45] Date of Patent: Jun. 15, 1993

[54] ADJUSTABLE PROXIMITY SWITCH MOUNTING ASSEMBLY

[75] Inventor: Tadeusz W. Piotrowski, Cincinnati, Ohio

[73] Assignee: Cincinnati Milacron, Inc., Cincinnati, Ohio

[21] Appl. No.: 730,535

[22] Filed: Jul. 16, 1991

[51] Int. Cl.$^5$ .............................................. H01H 9/02
[52] U.S. Cl. ................................... 200/296; 248/27.1; 361/417
[58] Field of Search ............... 200/293, 294, 295, 296; 335/153, 205, 206, 207; 248/316.1, 27.1, 27.3; 307/113, 116, 117, 142; 361/417, 419; 336/65, 67, 30, 210; 73/104, 105, 745; 33/550

[56] References Cited

U.S. PATENT DOCUMENTS

| | | | |
|---|---|---|---|
| 2,831,129 | 4/1958 | Penney | 307/113 |
| 3,589,656 | 6/1971 | Protzmann | 248/27.1 |
| 4,213,110 | 7/1980 | Holce | 335/205 X |
| 4,410,155 | 10/1983 | Wetterhorn et al. | 248/27.1 |
| 4,487,469 | 12/1984 | Bjork | 403/349 X |
| 4,632,352 | 12/1986 | Stoll | 248/313 |
| 4,680,436 | 7/1987 | Brausfeld et al. | 73/745 X |
| 4,752,657 | 6/1988 | Kane et al. | 73/745 X |
| 4,800,241 | 1/1989 | McNamara | 335/205 X |
| 4,876,531 | 10/1989 | Dondorf | 73/745 X |
| 4,899,252 | 2/1990 | Birzer | 200/296 X |
| 4,912,291 | 3/1990 | Hepperle et al. | 73/745 X |
| 4,922,064 | 5/1990 | Price et al. | 200/61.7 |

FOREIGN PATENT DOCUMENTS

| | | | |
|---|---|---|---|
| 1958431 | 6/1971 | Fed. Rep. of Germany | 200/296 |
| 218786 | 7/1924 | United Kingdom | 200/296 |

OTHER PUBLICATIONS

Advertising Brochure from Micro Switch, a Honeywell Division, entitled Harsh Duty Stainless Steel Proximity Sensor, no date.

Primary Examiner—Renee S. Luebke
Assistant Examiner—Glenn T. Barrett
Attorney, Agent, or Firm—Frost & Jacobs

[57] ABSTRACT

A proximity switch mounting plate is rotatable about a center point and releasably-clamped to a mounting surface of a device. The cylindrical proximity switch is attached to the mounting plate at a location spaced outwardly from the center point, and the detection end of the switch extends to a moving member within the device. Rotation of the mounting plate around its center point adjusts the radial position of the detection end of the switch.

17 Claims, 3 Drawing Sheets

ADJUSTABLE PROXIMITY SWITCH MOUNTING ASSEMBLY

BACKGROUND OF THE INVENTION

Proximity switches are used in a variety of machine applications, such as for monitoring the location of moving parts of various devices. Very often, the moving part to be monitored is located within a casing or cover portion of a device, or in another similarly remote position. For machine design and safety considerations, moving parts are generally shielded in one way or another so as to be effectively isolated from inadvertent access by operators, assemblers and the like. Proximity switches, on the other hand, must be located adjacent moving parts to accurately monitor location and travel thereof, and must often be adjusted during assembly and/or operation. Accordingly, adjustment of proximity switches has often been inconvenient and unwieldy.

Proximity switches themselves are generally cylindrical electrical devices, with a magnetic flux at one end for detection of a moving member. In some applications, machine members may move axially of the cylindrical switch, i.e., toward and away from the detection end or face. Many such switches have finely-threaded portions to facilitate attachment and axial adjustment of the switch, and lock nuts to secure the switch once positioned.

In other applications, a machine member may move radially of the switch, e.g., across the detection face. It is a more difficult task to adjust the switch radially, with precision. Adjustable mounting plates have been used, but very fine adjustments (e.g., on the order of several thousandths of an inch) are difficult to consistently obtain, when an assembler has to directly slide a mounting plate. The provision of fine adjustment screws and an adjusting bracket adds to the complexity of the machine assembly, and overall cost. Heretofore, there has not been available a relatively simple adjustment device or arrangement which provided the ability to make precise, radial adjustments of a proximity switch in a convenient, reliable manner

DISCLOSURE OF THE INVENTION

It is an object of the present invention to obviate the above-described problems and shortcomings of prior art techniques and devices for mounting and providing adjustability for proximity switches.

It is also an object of the present invention to provide precise radial adjustment of a proximity switch in a relatively simple and reliable manner.

It is yet another object of the present invention to provide an improved mounting assembly for a proximity switch which enables radial adjustment of the switch in a simple and reliable structure.

In accordance with one aspect of the present invention, there is provided an adjustable assembly for positioning a proximity switch within a machine, wherein the switch has a mounting end and a detection end which extends axially through a bore in a mounting surface of the machine to a location where its detection end is adjacent a moving part of the machine. The assembly includes an adjustable mounting plate having an outer peripheral edge circumscribing a center point. The mounting plate further includes an outwardly extending flange which can be adjustably secured adjacent the mounting surface of the machine, such as by one or more clamps or a slot/bolt arrangement. The proximity switch is attached adjacent its mounting end to the plate, such as via a threaded mounting bore spaced on the plate from the center point. In a preferred embodiment, the assembly also includes a collar or sleeve which depends downwardly from the underside of the mounting plate and which is sized to rotatably support the assembly within the bore formed in the mounting surface of the machine. The adjustable assembly is thereby selectively rotatable around its center point and a longitudinal axis passing therethrough, whereby the position of the detection end of the switch may be precisely radially adjusted with respect to the bore.

BRIEF DESCRIPTION OF THE DRAWINGS

While the specification concludes with claims particularly pointing out and distinctly claiming the present invention, it is believed the same will be better understood from the following description taken in conjunction with the accompanying drawings in which:

DETAILED DESCRIPTION OF THE INVENTION

Figure 1:
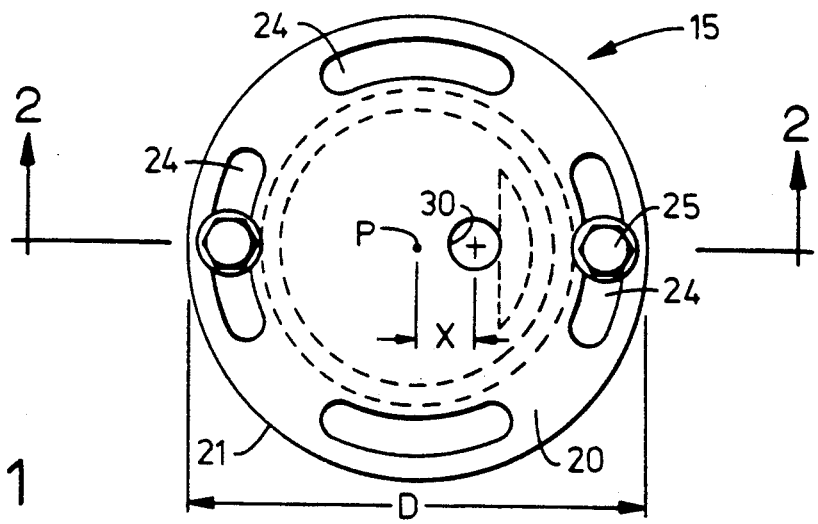
FIG. 1 is a top plan view of an adjustable proximity switch mounting assembly made in accordance with the present invention.
Figure 2:
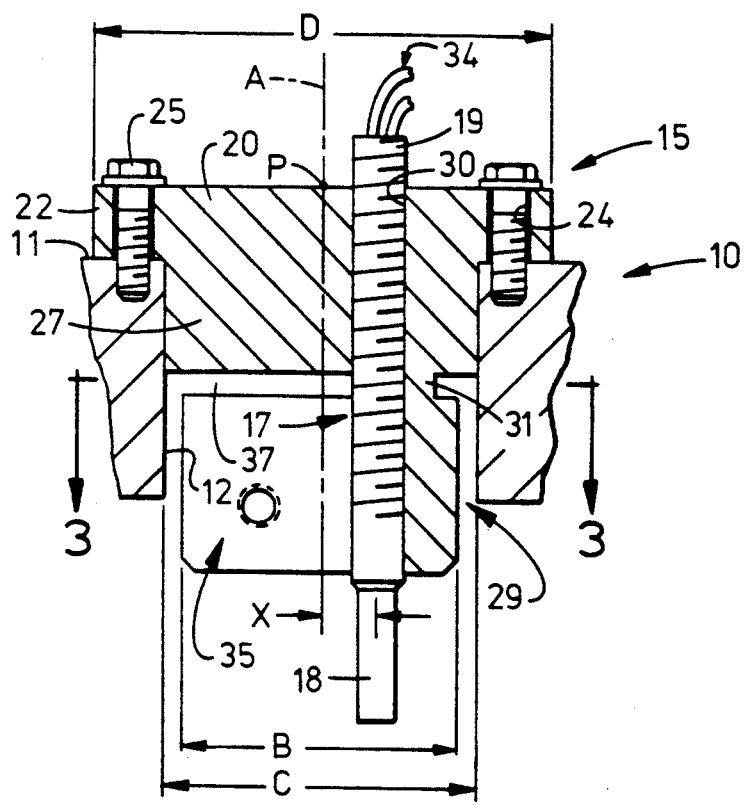
FIG. 2 is a cross-sectional view of the adjustable assembly of FIG. 1 taken along line 2—2 thereof.
Figure 3:
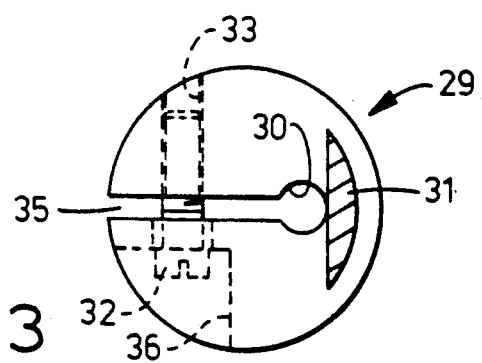
FIG. 3 is a cross-sectional view of the adjustable assembly of FIG. 2 taken along line 3—3 thereof.

Referring now to the drawings in detail, wherein like numerals indicate the same elements throughout the views, FIGS. 1-3 illustrate a preferred embodiment of an adjustable proximity switch mounting assembly 15 of the present invention. Particularly, FIG. 1 is a top plan view of adjustable assembly 15, which comprises mounting plate 20 having an outer peripheral edge 21 with a predetermined diameter D. While the shape of peripheral edge 21 is preferably substantially circular, this is not critical, and alternate shapes may be desirable in certain applications. For example, because assembly 15 is to be rotatable about its central axis A, as will be explained, the outer conformation of peripheral edge 21 might preferably take any of a variety of shapes to avoid interference with adjacent machine structure, or to address other functional or aesthetic requirements.

Spaced a predetermined distance X from the point at which central axis A passes through mounting plate 20 (i.e., center point P) is a switch mounting bore 30. While mounting bore 30 can comprise any means for attaching a proximity switch 17 to mounting plate 20, it is preferred to provide a close fitting or threaded bore as shown in FIGS. 1 and 2 to adjustably receive the mounting end 19 of switch 17. In this way, axial adjustment in a direction parallel to central axis A can be achieved by appropriate axial movement and/or threaded adjustment of switch 17 within switch mounting bore 30. Once adjusted, a clamping means 29 is provided for maintaining the axial position of switch 17 relative to plate 20.

A cap screw 32 mounted within a threaded counterbore 33 of clamping collar 29 is provided to maintain switch 17 in a desired axial position relative to adjustable assembly 15. It is preferred to countersink (e.g., see countersink 36) cap screw 32 below mounting plate 20 (i.e., within clamping collar 29) in order that it will be relatively inaccessible in operation and, thereby, relatively tamperproof. As will be appreciated, clamping collar 29 can be integrally formed with collar 27, and connected thereto by bridge 31. Horizontal slot 37 can be formed by slicing through a portion of the cross-section of collar 27, leaving only bridge 31 as a connection. Clamping collar 29 has a vertical slot 35 formed along its length opposite from bridge 31, to enable clamping adjustment of clamping collar 29 on a switch 17 held within bore 30. Tightening of cap screw 32 binds clamping collar 29 around a switch 17 held within bore 30, creating a friction lock.

Depending downwardly from the lower surface of mounting plate 20 is the substantially cylindrical collar 27, shown with a predetermined length L. Collar 27 preferably rotatably and coaxially journals adjustable assembly 15 within bore 12 formed within the mounting surface 11 of a machine or device 10. As seen best in FIG. 2, collar 27 will have an effective outer diameter C appropriately sized to accurately rotatably support assembly 15 within bore 12. While collar 27 is illustrated in FIG. 3 as comprising a substantially continuous cylindrical member, it is contemplated that a plurality of spaced, downwardly extending members could alternately be equally substituted therefore to reduce weight, material requirements, and the like. As seen best in FIG. 2, it may be preferred for ease of assembly to provide clamping collar 29 with an outer diameter B slightly smaller than diameter C.

As seen best in FIG. 2, mounting plate 20 further comprises an outwardly extending flange portion 22 which overlies the periphery of bore 12 on mounting surface 11 of device 10. Flange 22 is preferably utilized to provide means for adjustably securing plate 20 adjacent mounting surface 11, such as via one or more mounting slots 24 and attachment bolts 25. As seen best in FIGS. 1 and 3, adjustable mounting means can be provided by one or more arcuate slots 24 located on a circular path circumscribing center point P of mounting plate 20 about which adjustable assembly 15 will be rotated.

Figure 4:
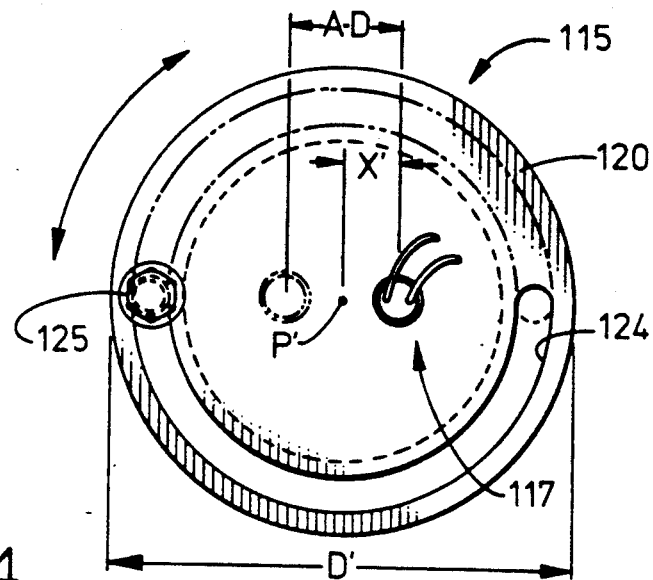
FIG. 4 is a top plan view of an alternate embodiment of an adjustable assembly made in accordance with the present invention.

While it may be preferred to utilize pairs of oppositely disposed adjustable mounting slots 24 (as seen in FIGS. 1-3), a single slot 124 may better suffice in some applications (as shown in FIG. 4). As will be understood, for adjustment procedures, bolts 25 would be loosened so that mounting plate 20 could be rotated about its center point and relative to mounting surface 11. Such rotation will, in turn, radially adjust the position of detection end 18 of proximity switch 17 with respect to bore 12. Once proximity switch 17 is adjusted to its proper radial position within device 10, fasteners 25 are secured to clamp mounting plate 20 with device 10.

As will also be understood, if a pair of fasteners or bolts 25 are utilized, as illustrated in FIG. 1, collar 27 is not critical for supporting assembly 15 for rotation; however, where it is preferred to maintain more accurate alignment of the detection end 18 of switch 17 during adjustment procedures, collar 27 may be required. As can be appreciated by comparison of the shapes and sizes of the various adjustable mounting slots (e.g., 24 and 124 of FIGS. 1-4), the amount of radial adjustment which the adjustable assembly of the present invention can provide for any particular proximity switch can be greatly varied between applications. For example, as seen best in FIG. 4, single mounting slot 124 can provide approximately 180° of rotational adjustment for assembly 15.

As mentioned above, proximity switch 117 is preferably attached adjacent its mounting end to plate 20 at a desired distance X (X' in FIG. 4) from the center point P (P' in FIG. 4). As illustrated in phantom in FIG. 4, rotation of mounting plate 120 approximately 180° will correspondingly adjust the position of the detection end of switch 117 a total adjustment distance AD equal to 2X'. In this way, it can be seen that required lateral adjustments can be provided in particular adjustable assemblies of the present invention by proper choice of the offset distance X'.

The structure of the present invention also enables improved precision in adjusting the position of the detection end of a switch, through the relationship of diameter D of mounting plate 20 relative to the offset distance X. Particularly, the manual force or movement applied at the outer peripheral edge 21 of mounting plate 20 is applied at a distance D divided by two (D÷2), while the movement of proximity switch 17 and its detection end 18 resulting from rotation of mounting plate 20 will be proportionally smaller depending upon the offset distance X. For example, if offset distance X is equal to the ratio of D divided by four (D÷4), then the detection end 18 of switch 17 will be moved only half the distance traversed by any particular point on the peripheral edge 21. Consequently, appropriate design of adjustable assembly 15 can provide for relatively fine and sensitive adjustment of switch 17 without requiring complex adjustment structures. Moreover, sensitivity of such adjustment can be easily designed into assembly 15 by using an appropriate offset distance for a particular diameter D.

Figure 5:
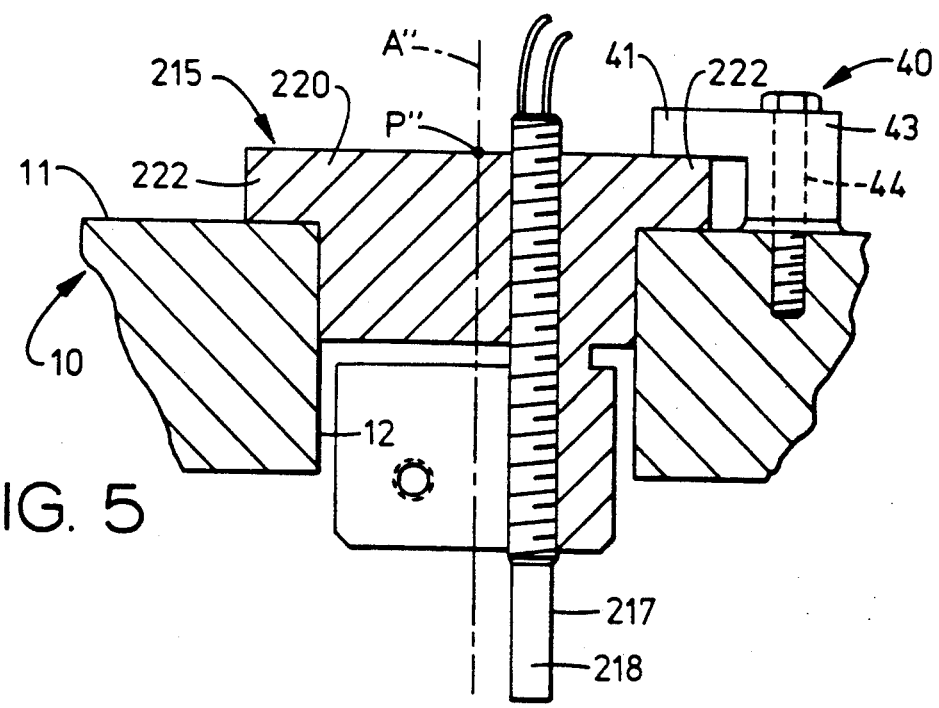
FIG. 5 is a cross-sectional view of yet another preferred embodiment of the adjustable assembly of the present invention, illustrating an alternate means for securing the mounting plate adjacent the mounting surface of a machine.

Still another preferred embodiment of the adjustable assembly of the present invention is shown in FIG. 5. Particularly, adjustable assembly 215 does not include any adjustable mounting slots such as slots 24 and 124 shown in FIGS. 1 and 4, respectively. Instead, the means for adjustably securing plate 220 adjacent mounting surface 11 comprises a clamping assembly 40, comprising a cantilevered jaw 41 extending outwardly from an upstanding base 43. One or more bolts 44 selectively tightens jaw 41 against outwardly extending flange 222 of mounting plate 220 to clamp assembly 15 with device 10, as desired.

It is contemplated that one or more clamping assemblies 40 would be located about bore 12 of device 10, and would permit adjustable rotation of assembly 215 about substantially 360° relative to mounting surface 11. Downwardly depending collar 227 would provide means for coaxially journaling assembly 215 in bore 12 for rotation about central axis A" (and center point P" of mounting plate 220). The balance of assembly 215 and its operation is similar to assemblies 15 and 115 described above. This arrangement may serve to enable maximal adjustment freedom in appropriate applications.

Figure 6:
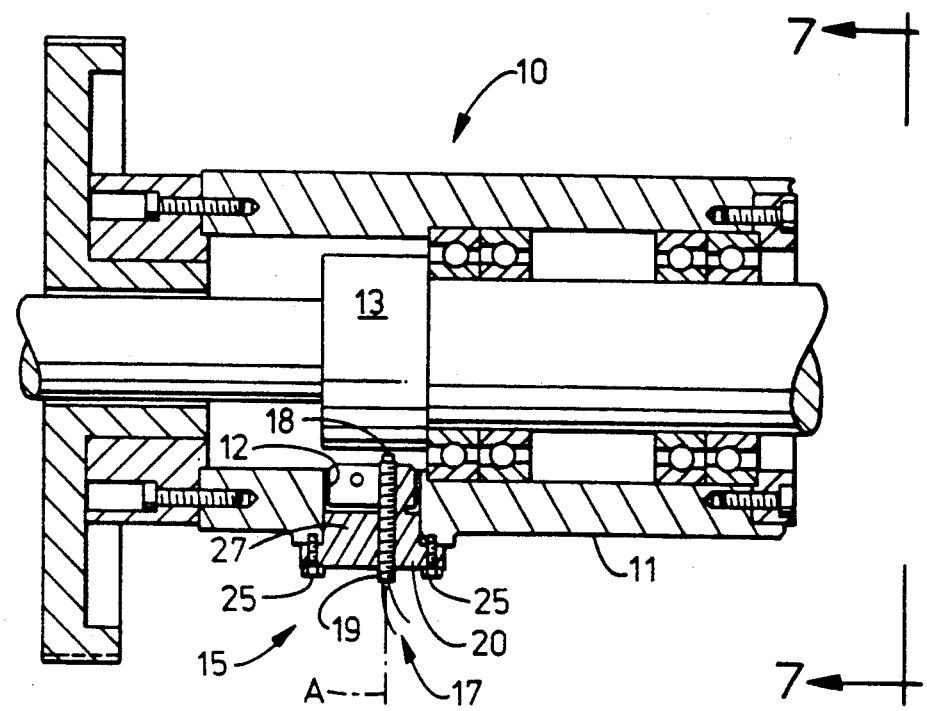
FIG. 6 is a simplified, cross-sectional view of a device incorporating an adjustable proximity switch mounting assembly of the present invention.
Figure 7:
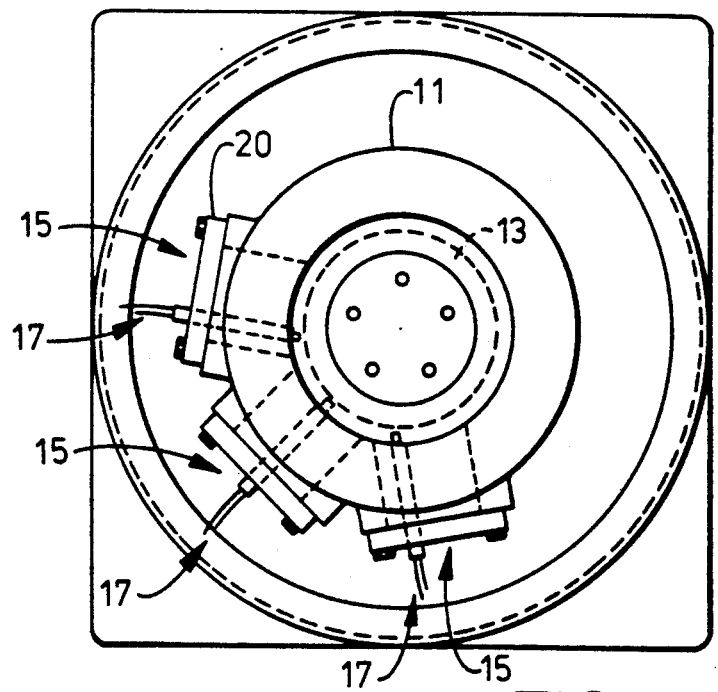
FIG. 7 is an end view of a device such as illustrated in FIG. 6, wherein a series of adjustable proximity switch mounting assemblies is utilized.

FIGS. 6 and 7 illustrate the application of one or more adjustable assemblies 15 in a machine device 10, such as a spindle or the like. Particularly, adjustable assembly 15 has its mounting plate 20 adjustably secured adjacent mounting surface 11 via a plurality of bolts 25, as described above. Collar 27 depends inwardly from plate 20 to coaxially journal assembly 15 within bore 12 for rotation about central axis A. A moving part 13, such as a rotating spindle shaft or the like, is situated within machine device 10, adjacent which detection end 18 of switch 17 must be situated. Axial adjustment of switch 17 is provided by threaded attachment through switch mounting bore 30, as described above, while precise radial adjustment relative to bore 12 is provided by appropriate rotation of assembly 15 prior to clamping procedures.

FIG. 7 shows a simplified end view of machine device 10, wherein a plurality of adjustable assemblies 15 may be utilized to locate a plurality of switches 17. As can be appreciated from FIGS. 6 and 7, convenient adjustment of the radial position of the detection end 18 of a proximity switch 17 is provided by the subject adjustment assembly.

It is contemplated that to provide accurate and sensitive adjustability of the detection end of a proximity switch in accordance with the present invention, the proximity switch will be attached in a substantially perpendicular orientation relative to mounting plates 20, whereby rotation of the plate provides relatively fine radial adjustment thereof.

Having shown and described the preferred embodiments of the present invention, further adaptions of the adjustable assembly described herein can be accomplished by modifications by one of ordinary skill in the art without departing from the scope of this invention. Several of these modifications have been mentioned, and others will be apparent to those skilled in the art. Accordingly, the scope of this invention should be considered in terms of the following claims, and is understood not to be limited to the specific details of structure and operation shown and described in the examples of the specification and drawings.

I claim:

1. An adjustable assembly for positioning a proximity switch at least partially within a device, and for use with a proximity switch which has a detection end and a mounting end, and which is to extend axially through a bore in a mounting surface of the device to a location where its detection end is adjacent a moving part of said device, said adjustable assembly comprising:
   an adjustable switch mounting plate having a peripheral edge and a center point;
   means for adjustably securing said plate adjacent said mounting surface, said securing means comprising an arcuate slot located on a circle circumscribing said center point, and a fastener within said slot for clamping said plate with said device;
   means for attaching said proximity switch adjacent its mounting end to said plate at a location spaced from said center point, whereby the detection end of an attached switch extends axially inwardly from said plate, through said bore; and
   means for rotating said plate around said center point and relative to said mounting surface, thereby radially adjusting the position of said detection end of said switch with respect to said bore.

2. An adjustable assembly for positioning a proximity switch within a device, wherein the switch has a detection end and a mounting end, and which is to extend axially through a bore in a mounting surface of the device to a location where its detection end is adjacent a moving part of said device, said adjustable assembly comprising:
   an adjustable switch mounting plate having a peripheral edge and a center point;
   means for adjustably securing said plate adjacent said mounting surface;
   means for attaching said proximity switch adjacent its mounting end to said plate at a location spaced from said center point, whereby said detection end extends axially inwardly from said plate, through said bore, said attaching means comprising a hole formed through said plate, said hole being spaced from said center point within said circle; and
   means for rotating said plate around said center point and relative to said mounting surface, thereby radially adjusting the position of said detection end of said switch with respect to said bore.

3. The adjustable assembly of claim 2, wherein said hole adjustably receives the proximity switch such that its mounting end may be selectively extended through said hole to adjust the axial location of said detection end.

4. The adjustable assembly of claim 2, wherein said proximity switch is attached in a substantially perpendicular orientation to said mounting plate at a location spaced radially outwardly from said center point within said diameter, whereby rotation of said plate permits relatively fine radial adjustment of said detection end.

5. An adjustable assembly for positioning a proximity switch within a device, wherein the switch has a detection end and a mounting end, and which is to extend axially through a bore in a mounting surface of the device to a location where its detection end is adjacent a moving part of said device, said adjustable assembly comprising:
   an adjustable switch mounting plate having a peripheral edge and a center point;
   means for adjustably securing said plate adjacent said mounting surface;
   means for attaching said proximity switch adjacent its mounting end to said plate at a location spaced from said center point, whereby said detection end extends axially inwardly from said plate, through said bore;
   means for rotating said plate around said center point and relative to said mounting surface, thereby radially adjusting the position of said detection end of said switch with respect to said bore; and
   a collar extending inwardly from said plate, said collar coaxially journaled in said bore for rotation about said center point.

6. An adjustable assembly for positioning a proximity switch within a device, wherein the switch has a detection end and a mounting end, and which is to extend axially through a bore in a mounting surface of the device to a location where its detection end is adjacent a moving part of said device, said adjustable assembly comprising:
   an adjustable switch mounting plate having a peripheral edge and a center point;

means for adjustably securing said plate adjacent said mounting surface, said means for adjustably securing said plater comprising a selectively releasable clamp device attached to said mounting surface and overlying a portion of said plate;

means for attaching said proximity switch adjacent its mounting end to said plate at a location spaced from said center point, whereby said detection end extends axially inwardly from said plate, through said bore; and means for rotating said plate around said center point and relative to said mounting surface, thereby radially adjusting the position of said detection end of said switch with respect to said bore.

7. An adjustable assembly for positioning a proximity switch at least partially within a device, and for use with a proximity switch which has a detection end and a mounting end, and which is to extend axially through a bore in a mounting surface of the device to a location where its detection end is adjacent a moving part of said device, said adjustable assembly comprising:

an adjustable switch mounting plate having a peripheral edge and an inwardly extending collar to be coaxially journaled in said bore for rotation about a center point;

means for adjustably securing said plate adjacent said mounting surface, said means for adjustably securing said plate comprising an arcuate slot located on a circle circumscribing said center point, and a fastener within said slot for clamping said plate with said device;

means for attaching said proximity switch adjacent its mounting end to said plate at a location spaced from said center point, whereby the detection end of an attached switch extends axially inwardly from said plate, through said bore; and means for rotating said plate around said center point and relative to said outer surface, thereby radially adjusting the position of said detection end of said switch with respect to said bore.

8. The adjustable assembly of claim 7, wherein said attaching means comprises a hole formed through said plate and within which said mounting end is adjustably received, said hole being spaced outwardly from said center point and inwardly from said peripheral edge.

9. The adjustable assembly of claim 7, wherein said proximity switch is attached in a substantially perpendicular orientation to said mounting plate at a location spaced radially outwardly from said center point and within said peripheral edge, whereby rotation of said plate permits relatively fine radial adjustment of said detection end.

10. The adjustable assembly of claim 7, wherein said assembly comprises a central longitudinal axis, and said center point is located substantially coincident with said axis.

11. An adjustable assembly for positioning a proximity switch at least partially within a device, and for use with a proximity switch which has a detection end and a mounting end, and which is to extend axially through a bore in a mounting surface of the device to a location where its detection end is adjacent a moving part of said device, said adjustable assembly comprising:

an adjustable switch mounting plate having a peripheral edge and an inwardly extending collar to be coaxially journaled in said bore for rotation about a center point;

means for adjustably securing said plate adjacent said mounting surface, said means for adjustably securing said plate comprising a selectively releasable clamp device attached to said mounting surface and overlying a portion of said plate;

means for attaching said proximity switch adjacent its mounting end to said plate at a location spaced from said center point, whereby the detection end of an attached switch extends axially inwardly from said plate, through said bore; and means for rotating said plate around said center point and relative to said outer surface, thereby radially adjusting the position of said detection end of said switch with respect to said bore.

12. An adjustable assembly for positioning a proximity switch at least partially within a device, and for use with a proximity switch which has a detection end and a mounting end, and which is to extend axially through a bore in a mounting surface of the device to a location where its detection end is adjacent a moving part of said device, said adjustable assembly comprising:

an adjustable switch mounting plate having an outer diameter, a center point, and an inwardly extending collar to be coaxially journaled in said bore for rotation about said center point;

means for adjustably securing said plate adjacent said mounting surface, said means for adjustably securing said plate comprising an arcuate slot located on a circle circumscribing said center point, and a fastener within said slot for clamping said plate with said device;

means for attaching said proximity switch adjacent its mounting end to said plate at a location spaced from said center point, whereby the detection end of an attached switch extends axially inwardly from said plate, through said bore, and wherein said attaching means permits axial adjustment of said mounting end relative to said plate; and means for rotating said plate around said center point and relative to said outer surface, thereby radially adjusting the position of said detection end of said switch with respect to said bore.

13. An adjustable assembly for positioning a proximity switch at least partially within a device, and for use with a proximity switch which has a detection end and a mounting end, and which is to extend axially through a bore in a mounting surface of the device to a location where its detection end is adjacent a moving part of said device, said adjustable assembly comprising:

an adjustable switch mounting plate having an outer diameter, a center point, and an inwardly extending collar to be coaxially journaled in said bore for rotation about said center point;

means for adjustably securing said plate adjacent said mounting surface, said means for adjustably securing said plate comprising a selectively releasable clamp device attached to said mounting surface and overlying a portion of said plate;

means on said plate for attaching a proximity switch adjacent its mounting end to said plate at a location spaced from said center point, whereby the detection end of an attached switch extends axially inwardly from said plate, through said bore, and wherein said attaching means permits axial adjustment of said mounting end relative to said plate to a desired axial position within the device; and means for rotating said plate around said center point and relative to said outer surface, thereby radially adjusting the position of said detection end of said switch with respect to said bore while maintaining its axial position.

14. The adjustable assembly of claim 13, wherein said attaching means comprises a hole formed through said plate, said hole being spaced outwardly from said center point within said mounting plate.

15. An adjustable assembly for positioning a proximity switch at least partially within a device, and for use with a proximity switch which as a detection end and a mounting end, and which is to extend axially through a bore in a mounting surface of the device to a location where its detection end is adjacent a moving part of said device, said adjustable assembly comprising:

an adjustable switch mounting plate having a peripheral edge and a center point;

means for adjustably securing said plate adjacent said mounting surface, said securing means comprising means for rotating a clamping collar attached below said mounting plate for maintaining the axial position of said switch relative to said plate;

means for attaching said proximity switch adjacent its mounting end to said plate at a location spaced from said center point, whereby the detection end of an attached switch extends axially inwardly from said plate, through said bore; and means for rotating said plate around said center point and relative to said mounting surface, thereby radially adjusting the position of said detection end of said switch with respect to said bore.

16. The adjustable assembly of claim 15, wherein said clamping collar comprises a fraction lock for maintaining said axial position of said switch.

17. The adjustable assembly of claim 15, wherein said clamping collar further comprises substantially tamper proof means for tightening said clamping collar around said switch to maintain said axial position.

* * * * *

UNITED STATES PATENT AND TRADEMARK OFFICE
CERTIFICATE OF CORRECTION

PATENT NO.  : 5,219,068
DATED       : June 15, 1993
INVENTOR(S) : Tadeusz W. Piotrowski It is certified that error appears in the above-identified patent and that said Letters Patent is hereby corrected as shown below:

In column 7, claim 6, line 3, delete "plater" and insert --plate--

In column 10, claim 16, line 13, delete "fraction" and insert --friction--

Signed and Sealed this

First Day of February, 1994

Attest:

BRUCE LEHMAN

Attesting Officer        Commissioner of Patents and Trademarks